US011686875B2

(12) United States Patent
Rubens et al.

(10) Patent No.: US 11,686,875 B2
(45) Date of Patent: Jun. 27, 2023

(54) STUD FINDER EMPLOYING PHOTOCHROMISM

(71) Applicant: Robert Bosch GmbH

(72) Inventors: Jeremy Rubens, Palatine, IL (US); Christopher Crowell, Chicago, IL (US)

(73) Assignees: Robert Bosch Tool Corporation, Broadview, IL (US); Robert Bosch GmbH, Stuttgart (DE)

( * ) Notice: Subject to any disclaimer, the term of this patent is extended or adjusted under 35 U.S.C. 154(b) by 206 days.

(21) Appl. No.: 17/119,261

(22) Filed: Dec. 11, 2020

(65) Prior Publication Data
US 2022/0187487 A1   Jun. 16, 2022

(51) Int. Cl.
| *G01R 19/00* | (2006.01) |
| *G01V 3/08* | (2006.01) |
| *F21V 9/08* | (2018.01) |
| *G01V 3/165* | (2006.01) |
| *G01R 27/26* | (2006.01) |
| *G01V 3/15* | (2006.01) |
| *F21Y 115/10* | (2016.01) |
| *F21W 111/00* | (2006.01) |
| *G01R 29/08* | (2006.01) |
| *G01R 31/60* | (2020.01) |
| *G01R 31/58* | (2020.01) |

(52) U.S. Cl.
CPC .............. *G01V 3/08* (2013.01); *F21V 9/08* (2013.01); *G01R 27/2605* (2013.01); *G01V 3/081* (2013.01); *G01V 3/15* (2013.01); *G01V 3/165* (2013.01); *F21W 2111/00* (2013.01); *F21Y 2115/10* (2016.08); *G01R 29/085* (2013.01); *G01R 31/58* (2020.01); *G01R 31/60* (2020.01)

(58) Field of Classification Search
CPC . G01V 3/08; G01V 3/165; G01V 3/15; G01V 3/088; G01V 3/081; F21V 9/08; G01R 27/2605; G01R 29/085; G01R 31/60; G01R 31/58; F21W 2111/00; F21Y 2115/10
USPC ...................................................... 324/66, 67
See application file for complete search history.

(56) References Cited

U.S. PATENT DOCUMENTS

| 6,502,319 | B1 | 1/2003 | Goodrich et al. |
| 6,708,782 | B1 | 3/2004 | Turney |
| 7,278,223 | B1 | 10/2007 | Dever et al. |
| 7,668,616 | B2 | 2/2010 | Piasse et al. |
| 7,977,026 | B2 | 7/2011 | Barr et al. |
| 10,524,592 | B2 | 1/2020 | Sergyeyenko et al. |
| 2005/0078303 | A1* | 4/2005 | Murray ................. G01C 15/00 356/138 |
| 2007/0175054 | A1* | 8/2007 | Murray ................. G01C 9/06 33/286 |

(Continued)

FOREIGN PATENT DOCUMENTS

| DE | 436397 | 3/1925 |
| EP | 0048469 | 3/1982 |
| WO | 2007084250 | 7/2007 |

*Primary Examiner* — Raul J Rios Russo
(74) *Attorney, Agent, or Firm* — Jeremy L. Hargis; Maginot, Moore & Beck LLP

(57) ABSTRACT

An improved detector device for locating studs and other objects behind a substrate (such as a wall) uses one or more light emitting diodes (LEDs) in combination with a photochromic compound to mark the locations on the substrate behind which objects are located.

11 Claims, 5 Drawing Sheets

(56) References Cited

U.S. PATENT DOCUMENTS

| | | | |
|---|---|---|---|
| 2007/0290843 A1* | 12/2007 | Manneschi | G01V 3/104 340/540 |
| 2010/0097212 A1* | 4/2010 | Wingate | G01V 3/15 324/67 |
| 2018/0252832 A1* | 9/2018 | Smoot | G01R 27/00 |
| 2020/0073006 A1* | 3/2020 | Guerrero, Sr. | G01V 3/165 |

* cited by examiner

US 11,686,875 B2

STUD FINDER EMPLOYING PHOTOCHROMISM

TECHNICAL FIELD

This disclosure relates to an improved detector device that uses one or more light emitting diodes (LEDs) in combination with a photochromic compound to mark the locations on a substrate (such as a wall) behind which objects (such as studs) are located.

BACKGROUND

Handheld detector devices, such as stud finders, are well-known in the art. In houses and other structures whose walls, ceilings, or floors comprise a substrate layer (such as wood or drywall) mounted to a frame of wood (or other material), it is sometimes desired to determine the locations where frame portions (such as studs or joists) or other objects are present behind the substrate. With prior art detector devices, a user typically slides the device along the substrate and the device activates one or more LEDs (or other user display device) to indicate the locations of objects behind the substrate. One problem with such prior art detector devices is that they do not create any mark or record of the object locations on the substrate, and instead the user must interpret the user display device and, if the user desires, mark the object locations on the substrate by hand. Thus, prior art detector devices do not allow for one-handed operation. The detector device described herein overcomes that limitation and others in the prior art.

SUMMARY

One aspect of this disclosure is directed to a handheld detector device comprising one or more LEDs that mark in a photochromic compound the locations on a substrate behind which objects are located. Photochromic materials are those that undergo a reversible change in color upon exposure to certain wavelengths of light, such as ultraviolet light. With optional additional sensors, such as a magnetic sensor or current sensor, the detector device is able to identify and distinguish between different types of objects behind a substrate, such as studs, metal pipes, and electrical conductors. When so equipped, the detector device can apply marks to the substrate (via the photochromic compound) that distinguish between the various types of objects by using differing styles of marks-such as hashed or solid lines. By using multiple LEDs arranged in a row along its substrate-facing surface, the detector device can further vary the thickness or style of such lines.

Another aspect of this disclosure is directed to a photochromic compound which is applied to a substrate to aid in recording the location of objects behind the substrate. Such a compound may be applied to the substrate directly (such as by spray, brush, roller, or the like) or indirectly by way of a separate medium (such as a sticker, sheet of paper, sheet of plastic, or the like). The photochromic compound comprises one or more pigments that change color when illuminated with predetermined wavelengths of light, such as ultraviolet light. The color change may last for up to fifteen minutes. Such pigments are commercially available under brand names including Solar Color Dust and TechnoGlow. The photochromic compound consists of a photochromic pigment suspended in any suitable base such as resin, epoxy, paint base, lacquer, glue, gel, varnish, or clear coat.

The above aspects of this disclosure and other aspects will be explained in greater detail below with reference to the attached drawings.

DETAILED DESCRIPTION

The illustrated embodiments are disclosed with reference to the drawings. However, it is to be understood that the disclosed embodiments are intended to be merely examples that may be embodied in various and alternative forms. The figures are not necessarily to scale and some features may be exaggerated or minimized to show details of particular components. The specific structural and functional details disclosed are not to be interpreted as limiting, but as a representative basis for teaching one skilled in the art how to practice the disclosed concepts.

Figure 1:
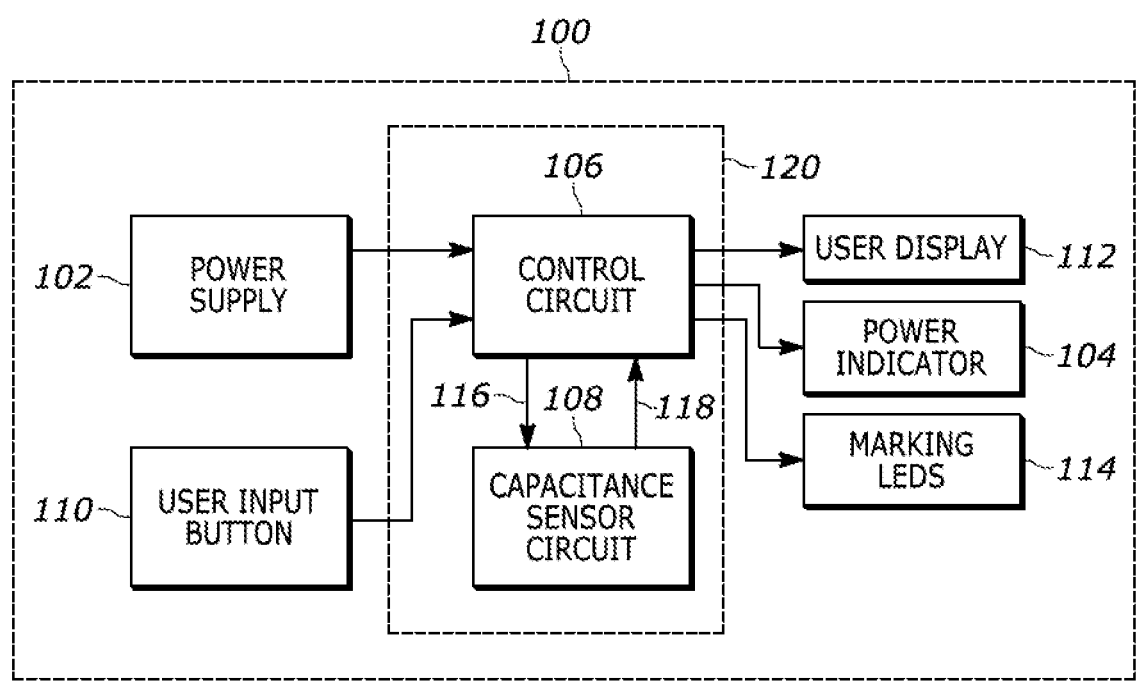
FIG. 1 is a schematic block diagram illustrating the electrical design of a detector device.

FIG. 1 is a schematic of the electrical design for a detector device 100. The detector device consists generally of a printed circuit board (PCB) within a housing. Mounted to the printed circuit board are various components including a power supply 102, a power indicator LED 104, a control circuit 106, a capacitance sensor circuit 108, a user input button 110, a user display 112, and one or more marking LEDs 114. The detector device may optionally include additional sensor circuits (not shown), such as a magnetic sensor or current sensor. The power supply 102 preferably comprises one or more replaceable alkaline batteries and supplies a DC operating voltage to the control circuit 106. Alternatively, the power supply 102 may comprise a rechargeable battery. The control circuit 106 is preferably an application specific integrated circuit (ASIC) comprising a microcontroller designed and programmed according to the flow chart set forth in FIG. 4.

A user powers on the detector device by pressing the user input button 110. The control circuit 106 indicates that power is present by illuminating the power indicator LED 104. While the detector device is in use, the control circuit sends a sinusoidal waveform 116 to the capacitance sensor circuit 108. The waveform is generated by a waveform generator or digital-to-analog converter (DAC) (not shown) that is preferably integrated as part of the ASIC. Alternatively, the waveform generator or DAC, which are commercially available devices, may be separate from the ASIC and mounted on the PCB. The control circuit 106 receives back from the capacitance sensor circuit 108 a modified waveform 118—a version of the sinusoidal waveform that has been, e.g., delayed or distorted, according to the measured capacitance of the capacitance sensor circuit. The modified waveform 118 is input to the control circuit 106 by way of an analog-to-digital converter (ADC) (not shown) that is preferably integrated as part of the ASIC. Alternatively, the ADC, which is a commercially available device, may be separate from the ASIC and mounted on the PCB. The control circuit 106 and capacitance sensor circuit 108 may collectively be referred to as a stud-finding circuit 120.

The capacitance sensor circuit 108 comprises a conductive plate adjacent the substrate-facing surface of the detector device 100. As is well-known in the art, the measured capacitance of the capacitance sensor circuit 108 varies according to the dielectric constant of the substrate against which the detector device 100 is placed, which in turn varies with whether an object is present behind the substrate. For example, where an object such as a stud is present behind a substrate such as a wall, the dielectric constant at that location may be higher relative to the surrounding substrate, leading to a higher measured capacitance at that location. A higher measured capacitance results in a higher degree of modification (e.g., distortion or delay) in the modified waveform 118 that the capacitance sensor circuit 108 outputs back to the control circuit 106.

The control circuit 106 analyzes the modified waveform 118 and determines whether an object is present behind the substrate based on the waveform's degree of modification relative to a baseline measurement taken during a calibration step that occurs at device power-up. Where additional sensors (e.g., magnetic sensor or current sensor) are present, the control circuit 106 also receives signals from those sensors. Based on the modified waveform 118 and any additional sensor signals, the control circuit determines whether an object detected behind the substrate is a wooden frame portion (e.g., stud) or other object (e.g., pipe or electrical wire). The control circuit 106 provides status information, including whether an object is present and, optionally, the type of object detected, to a user by way of the user display 112, which is preferably a series of LEDs. Optionally, the LEDs are multicolor LEDs, where the illuminated color indicates the type of object detected.

Where an object is present, the control circuit 106 activates one or more of the marking LEDs 114, which are preferably ultraviolet LEDs, and which emit light from the substrate-facing surface (see FIG. 3) of the detector device 100 housing to mark the location of the object in a photochromic compound that has been applied to the substrate. Where applicable, the control circuit 106 can indicate the type of object detected by applying different styles of marks-such as hashed or solid lines—for different object types. By using multiple LEDs arranged in a row along its substrate-facing surface, the detector device can further vary the thickness or style of such lines.

Figure 2:
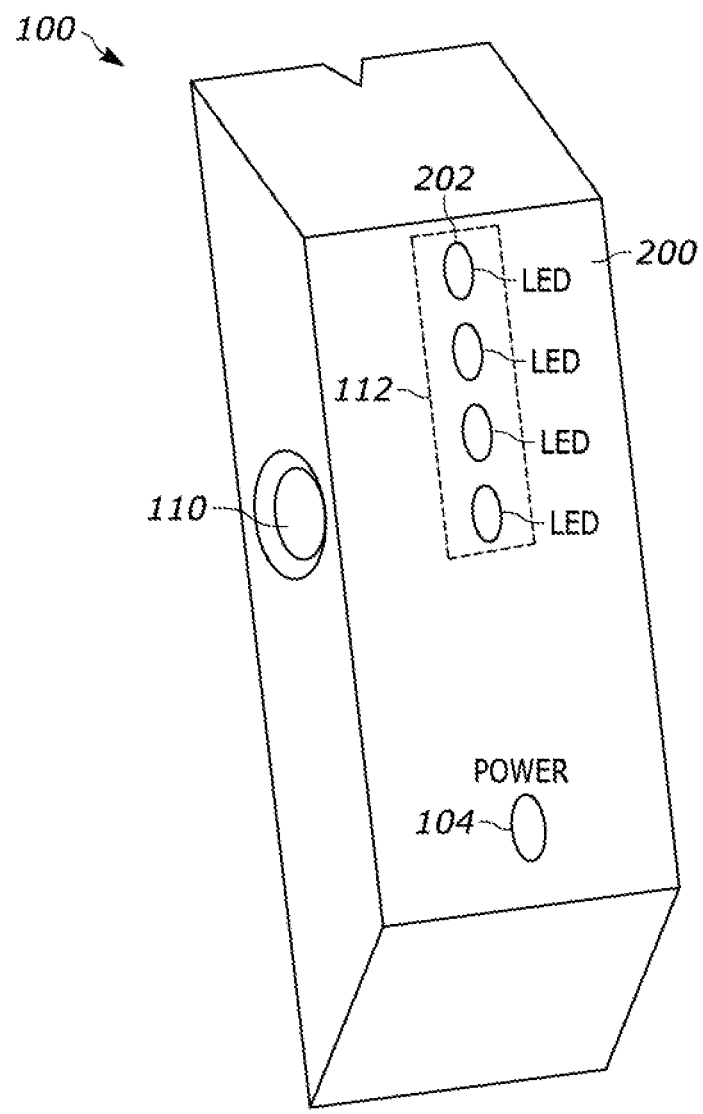
FIG. 2 is a perspective view of a detector device showing its user-facing surface.

FIG. 2 shows the user-facing surface 200 of the detector device 100 housing. The user display 112 and power indicator LED 104 are located on the user-facing side of the housing. Preferably, the user display consists of a series of LEDs. Alternatively, the user display is a liquid crystal display (LCD) or other graphical user display (not shown). As a user slides the detector device over a substrate, the LEDs of the user display 112 illuminate in succession as the detector device 100 approaches the location of an object behind the substrate, with more illuminated LEDs indicating a closer proximity to the object. Preferably, the final or topmost LED 202 illuminates when the detector device has crossed the edge of the object, and extinguishes once the detector crosses the opposite edge of the object.

Figure 3:
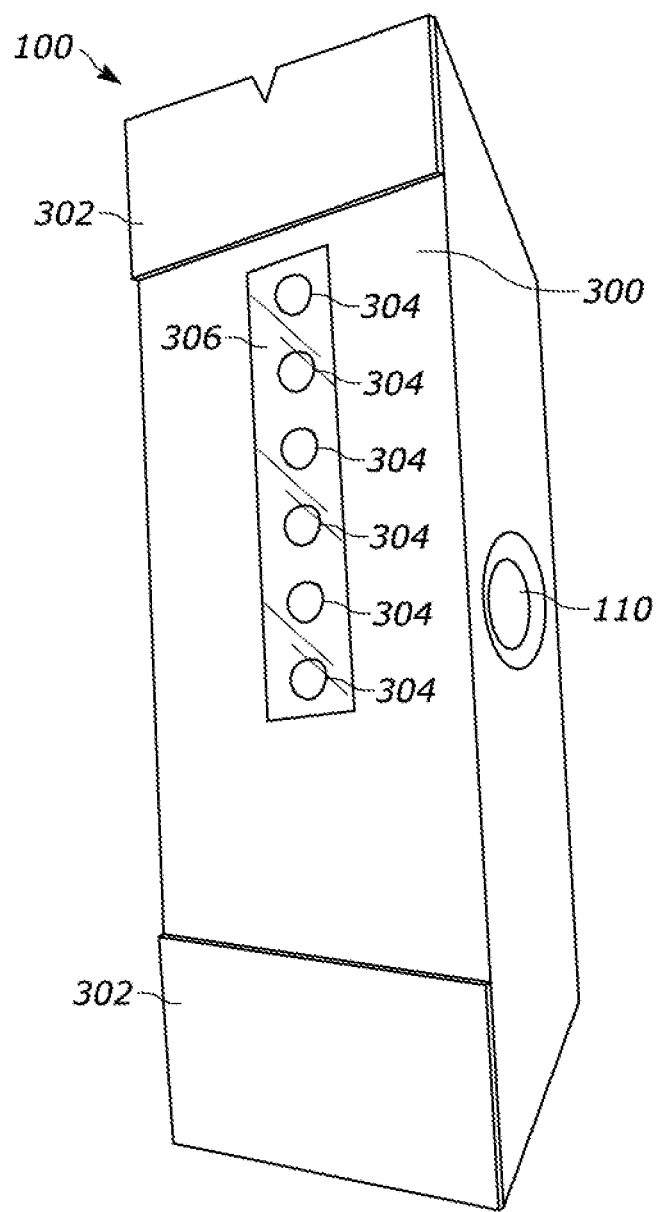
FIG. 3 is a perspective view of a detector device showing its substrate-facing surface.

FIG. 3 shows the substrate-facing surface 300 of the detector device 100 housing. The substrate-facing surface 300 contains two pads 302 of felt or other material to prevent scratching the substrate surface. The substrate-facing surface 300 also includes one or more apertures 304 through which light from the marking LEDs 114 is emitted. Preferably, the marking LEDs 114 illuminate whenever the topmost user-facing LED 202 is illuminated. The apertures are preferably inlayed with a clear plastic lens or waveguide 306 to direct light to the substrate surface.

Figure 4:
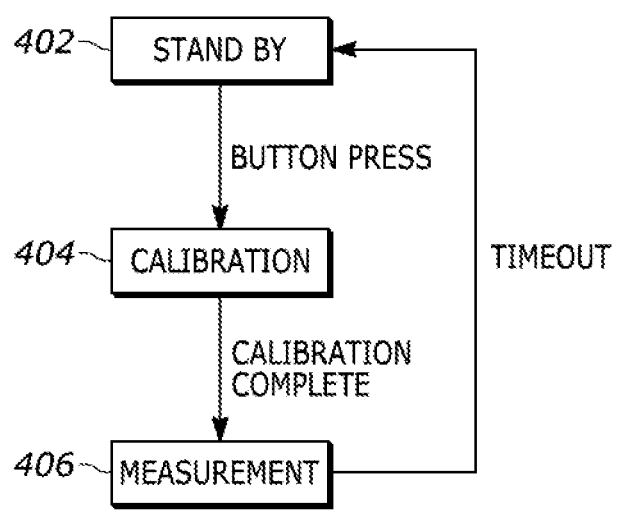
FIG. 4 is a state diagram illustrating the operation of the control circuit for a detector device.

FIG. 4 is a state diagram illustrating the operation of the control circuit 106. The control circuit begins in a standby state 402 and, upon a user pressing the user input button 110, enters a calibration state 404. During the calibration state 404, the control circuit 106 begins outputting the sinusoidal waveform 116 to the capacitance sensor circuit 108 and calculates a baseline capacitance based on the degree of modification of the modified waveform 118 it receives back. The control circuit 106 then proceeds to the measurement state 406. In this state, the control circuit 106 continues to output the sinusoidal waveform 116 to the capacitance sensor circuit 108 and calculates capacitance values based on the modified waveform 118 it receives back. As a user slides the detector device 100 over a substrate, the control circuit 106 continuously determines whether an object is located behind the substrate by comparing the calculated capacitance at each location to the baseline capacitance. In general, a substantial increase in capacitance at a location on the substrate (relative to the baseline capacitance) indicates the presence of an object behind that location. The control circuit 106 updates the user display 112 to indicate proximity to and the presence of any objects behind the substrate. If the control circuit 106 determines that an object is present at a location on the substrate, it activates one or more of the marking LEDs 114. Upon timing out, the control circuit 106 returns to the standby state 402.

Figure 5:
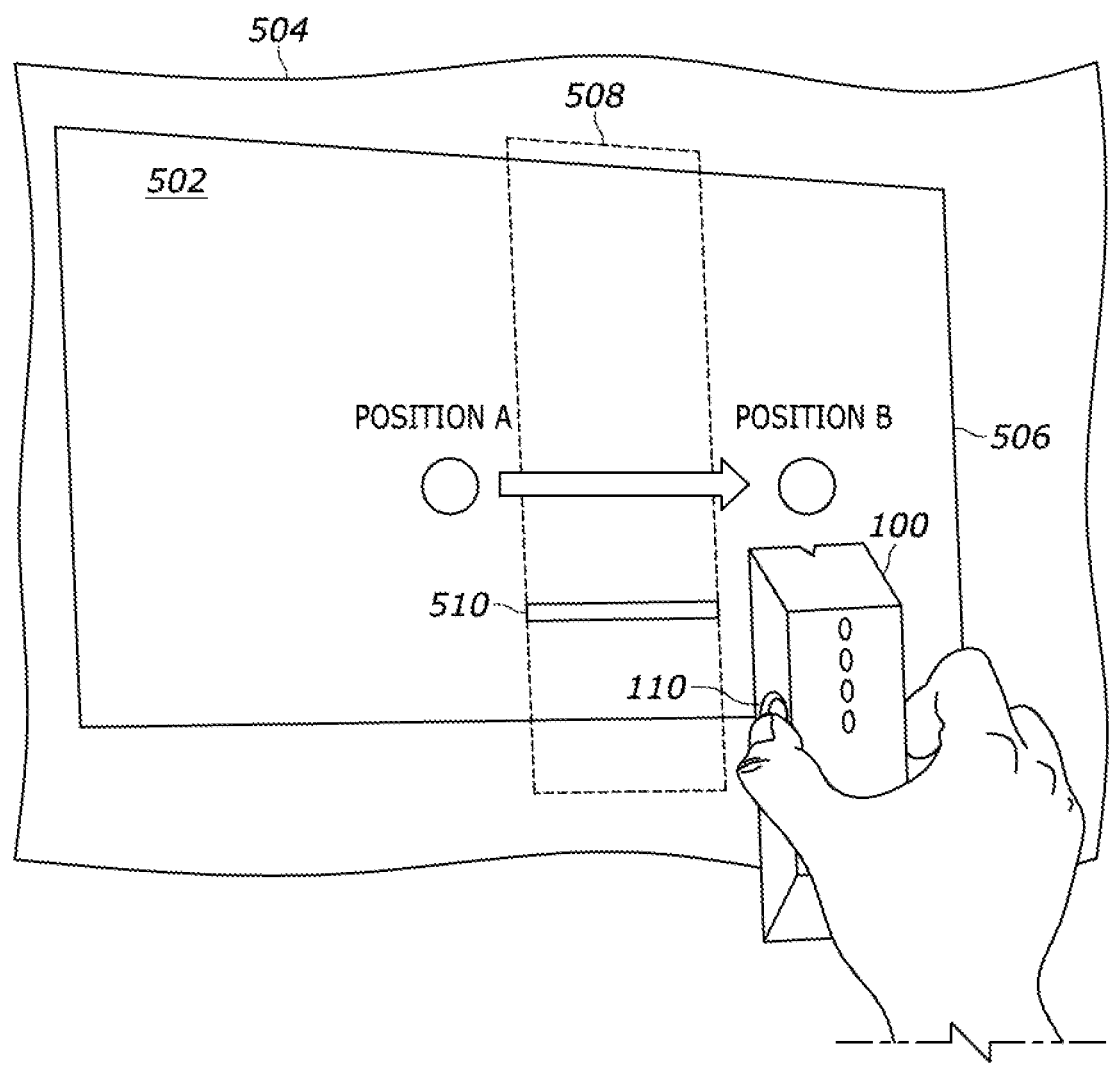
FIG. 5 is a perspective view of a detector device in use together with a photochromic compound that has been applied to a substrate.

FIG. 5 is an illustration of the detector device in operation. First, a photochromic compound 502 is applied to a substrate 504, preferably indirectly by way of a medium 506—such as a sticker or sheet of paper or plastic-fastened or adhered to the substrate 504. Alternatively, the photochromic compound 502 may be applied directly to the substrate by way of, e.g., a spray or roller (not shown). Once the photochromic compound 502 has been applied to the substrate 504, the user presses and releases the user input button 110 then slides the detector device 100 horizontally over the substrate 504 (e.g., from Position A to Position B), and the marking LEDs 114 are illuminated when the detector device 100 passes over a location on the substrate 504 behind which an object 508 is located, resulting in a visible mark 510 in the photochromic compound 502 that corresponds to the object 508 location.

While exemplary embodiments are described above, it is not intended that these embodiments describe all possible forms of the disclosed apparatus and method. Rather, the words used in the specification are words of description rather than limitation, and it is understood that various changes may be made without departing from the spirit and scope of the disclosure as claimed. The features of various implementing embodiments may be combined to form further embodiments of the disclosed concepts.

What is claimed is:
1. A handheld stud finder system, comprising:
 a housing having a surface configured to be placed proximate a substrate;
 a stud-finding circuit disposed within the housing, the stud-finding circuit configured to locate an object behind the substrate;
 an ultraviolet light source at least partially disposed within the housing, wherein the ultraviolet light source is configured to emit an ultraviolet light outward from the housing and towards the substrate;

a photochromic compound, configured to be applied to the substrate, wherein ultraviolet light causes the photochromic compound to change color; and a control circuit in communication with the stud-finding circuit and ultraviolet light source, configured to activate the ultraviolet light source when the surface of the housing is slid over a location on the substrate behind which an object is located thereby illuminating a portion of the photochromic compound with the ultraviolet light causing the portion of the photochromic compound to change color, wherein the changed color of the photochromic compound allows for the identification of a location on the substrate behind which an object is located based on the location of the portion of photochromatic compound that has changed color after the surface of the housing of the handheld stud finder is no longer proximate the substrate to where the object behind the substrate is located.

2. The system of claim 1, wherein the ultraviolet light source is a light emitting diode.

3. The system of claim 1, wherein the stud-finding circuit is configured to detect changes in a dielectric constant of the substrate.

4. The system of claim 3, wherein the stud-finding circuit has a capacitance sensor circuit configured to output a signal indicative of changes in a dielectric constant along a length of substrate.

5. The system of claim 1, wherein the substrate is a wall.

6. The system of claim 5, wherein the object is a vertical frame portion.

7. A method of identifying a location on a substrate behind which an object is located, comprising the steps of:
   applying a photochromic compound to a substrate portion, wherein the photochromic compound is configured to change color when illuminated by a predetermined wavelength of light;
   providing a detector device having a control circuit and a light source, wherein the control circuit is configured to activate the light source when the detector device is slid over a location on the substrate behind which an object is located and the light source is configured to, when activated, emit the predetermined wavelength of light;
   sliding the detector device over the substrate portion, thereby illuminating a portion of the photochromic compound with the predetermined wavelength of light causing the portion of compound to change color; and
   identifying the location on the substrate behind which an object is located based on the location of the portion of compound that has changed color.

8. The method of claim 7, wherein the light source is a light emitting diode.

9. The method of claim 8, wherein the predetermined wavelength of light is ultraviolet light.

10. The method of claim 7, wherein the step of applying a photochromic compound to a substrate portion includes applying the photochromic compound directly to the substrate.

11. The method of claim 7, wherein the step of applying a photochromic compound to a substrate portion includes applying the photochromic compound indirectly to the substrate by way of a medium.

\* \* \* \* \*